US012701941B2

(12) United States Patent
Park et al.

(10) Patent No.: US 12,701,941 B2
(45) Date of Patent: Aug. 4, 2026

(54) METHOD AND STRUCTURE TO FORM CONNECTOR TABS IN SUBTRACTIVE PATTERNING

(71) Applicant: International Business Machines Corporation, Armonk, NY (US)

(72) Inventors: Chanro Park, Clifton Park, NY (US); Koichi Motoyama, Clifton Park, NY (US); Hsueh-Chung Chen, Cohoes, NY (US); Yann Mignot, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 594 days.

(21) Appl. No.: 17/873,674

(22) Filed: Jul. 26, 2022

(65) Prior Publication Data

US 2024/0038547 A1      Feb. 1, 2024

(51) Int. Cl.
| | |
|---|---|
| *H10P 50/00* | (2026.01) |
| *H10P 76/40* | (2026.01) |
| *H10W 20/43* | (2026.01) |
| *H10W 20/00* | (2026.01) |

(52) U.S. Cl.
CPC ............ *H10P 50/71* (2026.01); *H10P 76/405* (2026.01); *H10P 76/4085* (2026.01); *H10W 20/43* (2026.01); *H10W 20/062* (2026.01)

(58) Field of Classification Search
CPC ........... H01L 21/32139; H01L 21/0332; H01L 21/0337; H01L 23/528; H01L 21/7684; H01L 21/76885; H01L 23/5283; H01L 21/3213; H10P 50/71; H10P 76/405; H10P 76/4085; H10W 20/43; H10W 20/062; H10W 20/063; H10W 20/0633; H10W 20/435
See application file for complete search history.

(56) References Cited

U.S. PATENT DOCUMENTS

| | | | |
|---|---|---|---|
| 7,842,601 | B2 | 11/2010 | Lee et al. |
| 9,793,163 | B2 | 10/2017 | Bristol et al. |
| 10,340,180 | B1 | 7/2019 | Chen et al. |
| 10,867,853 | B2 | 12/2020 | Lin et al. |
| 10,892,223 | B2 | 1/2021 | Schenker et al. |
| 11,139,205 | B2 | 10/2021 | Zhong et al. |
| 2004/0178169 | A1* | 9/2004 | Desphande ....... H01L 21/31144 257/E21.252 |
| 2005/0051434 | A1* | 3/2005 | Mishima ................ C25D 21/22 204/263 |
| 2018/0138051 | A1* | 5/2018 | deVilliers ........... H01L 21/0337 |
| 2020/0111920 | A1 | 4/2020 | Sills et al. |
| 2021/0005511 | A1* | 1/2021 | Lin ..................... H01L 21/0334 |
| 2021/0391215 | A1 | 12/2021 | Feng et al. |
| 2022/0020688 | A1 | 1/2022 | Xie et al. |

* cited by examiner

*Primary Examiner* — Davienne N Monbleau
*Assistant Examiner* — John Patrick Cornely
(74) *Attorney, Agent, or Firm* — Scully, Scott, Murphy & Presser, P.C.; Samuel Waldbaum

(57) ABSTRACT

A substrative patterning process is provided that forms an interconnect structure including a connector tab located between two adjacent electrically conductive line structures. The connector tab and the two adjacent electrically conductive line structures are of unitary construction and are located in a same metallization level.

14 Claims, 5 Drawing Sheets

METHOD AND STRUCTURE TO FORM CONNECTOR TABS IN SUBTRACTIVE PATTERNING

BACKGROUND

The present application relates to semiconductor technology, and more particularly to a method of forming an interconnect structure having a connector tab located between two adjacent electrically conductive line structures, wherein the connector tab and the two adjacent electrically conductive line structures are of unitary construction and are located in a same metallization level.

In integrated circuits (ICs), interconnect structures are employed to connect two or more circuit elements (such as, for example, transistors) together electrically. The design and layout of the interconnect structures on an IC is vital to its proper function, performance, power efficiency, reliability, and fabrication yield.

Interconnect structures are formed in the back-end-of-the-line (BEOL) utilizing processes well known to those skilled in the art including, for example, single damascene or dual damascene processes. Interconnect structures include electrically conductive metal structures such as, for example, metal vias and/or metal lines, embedded in an interconnect dielectric material. In order to electrically couple two or more parallel electrically conductive line structures within a given metallization level, an upper electrically conductive routing layer or a lower electrically conductive routing layer is typically issued. The upper or lower electrically conductive routing layer is formed in a metallization level that is different from the metallization level including the two or more parallel electrically conductive line structures that are desired to be coupled. The upper or lower electrically conductive routing layer consumes vertical real estate of a semiconductor structure that includes such an interconnect structure.

SUMMARY

A substrative patterning process is provided that forms an interconnect structure including a connector tab located between two adjacent electrically conductive line structures. The connector tab and the two adjacent electrically conductive line structures are of unitary construction and are located in a same metallization level thus the interconnect structure of the present application reduces the vertical real estate of a semiconductor structure that includes the same. Moreover, the connector tab does not add resistance to the metallization level which can lead to improved device performance.

In one aspect of the present application, a method of forming an interconnect structure is provided. In one embodiment of the present application, the method includes providing a patterned hard mask on a surface of an electrically conductive material layer, wherein the patterned hard mask includes at least a first hard mask line structure and a second hard mask line structure, the second hard mask line structure is oriented parallel to the first hard mask line structure. Next, a planarization layer is formed laterally adjacent to, and above, the first hard mask line structure and the second hard mask line structure, wherein the planarization layer includes an opening that extends to the electrically conductive material layer and is located between the first hard mask line structure and the second hard mask line structure. A tab forming sacrificial gap fill material structure is then formed in the opening, and thereafter the planarization layer is removed to reveal each of the tab forming sacrificial gap fill material structure, the first hard mask line structure and the second hard mask line structure. The electrically conductive material layer is then patterned utilizing the patterned hard mask and the tab forming sacrificial gap fill material structure as a combined etch mask to provide a first electrically conductive metal-containing line and a second electrically conductive metal-containing line that are connected together by a connector tab. Next, the patterned hard mask and the tab forming sacrificial gap fill material structure are removed.

In another aspect of the present application, an interconnect structure is provided. In one embodiment, the interconnect structure includes a first electrically conductive metal-containing line, a second electrically conductive metal-containing line, and a connector tab located between, and connecting, the first electrically conductive metal-containing line and the second electrically conductive metal-containing line. In accordance with the present application, the first electrically conductive metal-containing line, the second electrically conductive metal-containing line and the connector tab are of unitary construction and are composed of a compositionally same electrically conductive material.

DETAILED DESCRIPTION

Figure 1:
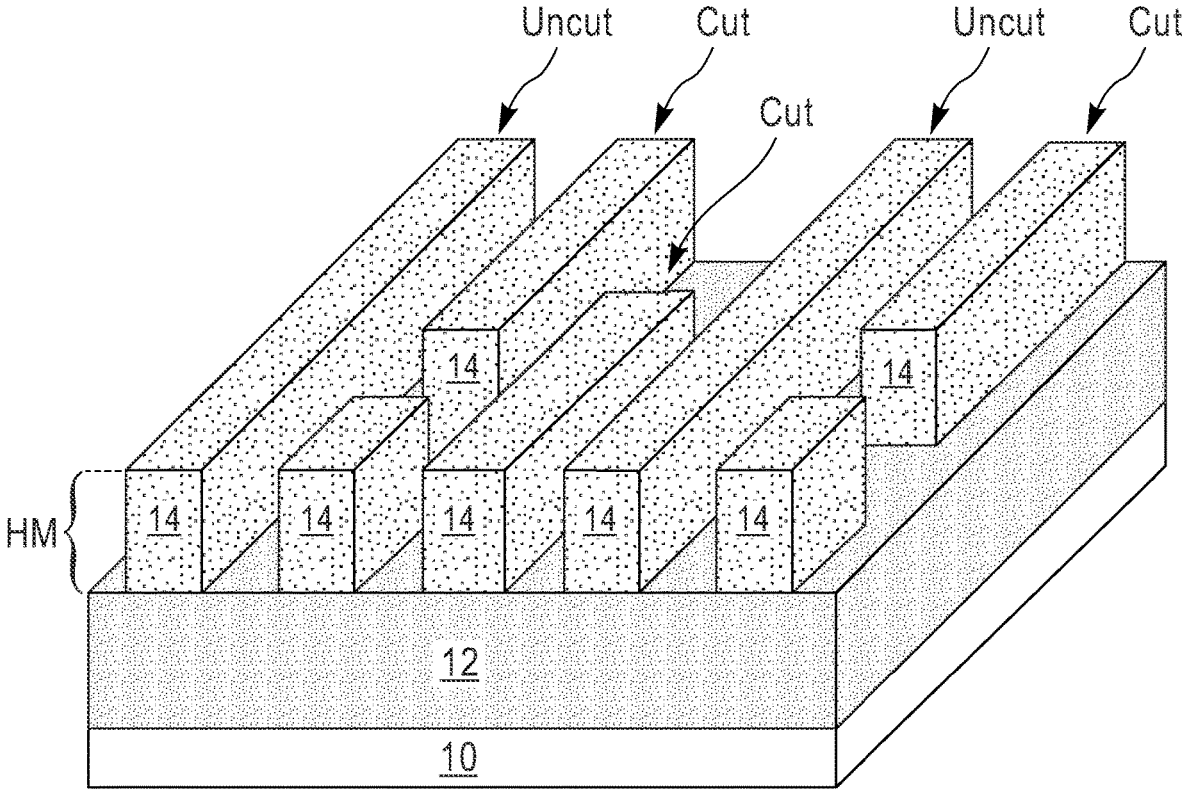
FIG. 1 is a three dimensional (3D) illustration of an exemplary structure that can be employed in the present application, the exemplary structure includes a substrate, an electrically conductive material layer located on the substrate, and a patterned hard mask located on the electrically conductive material layer, the patterned hard mask including a plurality of hard mask line structures.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

A method (i.e., subtractive patterning process) of forming an interconnect structure including a connector tab located between two adjacent electrically conductive line structures is provided. The method (i.e., substrative patterning process) forms the connector tab and the two adjacent electrically conductive line structures at a same time and within the same metallization level. In the present application, the term "connector tab" denotes an electrically conductive connector structure that connects two adjacent conductive line structures together. In the present application, the two electrically conductive line structures that are coupled together by the connector tab are oriented parallel to each other. In the present application, more that one connector tab can be formed within a given metallization level.

The interconnect structure that is formed utilizing the subtractive patterning process of the present application reduces the vertical real estate of a semiconductor structure that includes the same. Moreover, the connector tab that is formed by the subtractive patterning process does not add resistance to the metallization level which can lead to improved device performance. Furthermore, and in some embodiments, the metal can create fat metal wires (i.e., power buses) by merging minimum electrically conductive lines.

These and other aspects of the present application will now be described in greater detail by referring to the processing steps that are illustrated in FIGS. 1-6. It is noted that the processing steps shown in FIGS. 1-6 illustrate an embodiment of the present application in which a single connector tab is formed between two adjacent electrically conductive line structures. Although the present application describes and illustrates such an embodiment, the present application can be used to form more than one connector tab so as to provide an interconnect structure in which more that two electrically conductive line structures within a given metallization level are electrically connected to each other.

Referring first to FIG. 1, there is illustrated an exemplary structure that can be employed in the present application. The exemplary structure includes a substrate 10, an electrically conductive material layer 12 located on the substrate 10, and a patterned hard mask, HM, located on the electrically conductive material layer 12. The patterned hard mask, HM, contains a plurality of hard mask line structures 14. The hard mask line structures 14 can include uncut hard mask line structures, cut hard mask line structures or a combination thereof as is shown, for example, in FIG. 1. Cut hard mask line structures have a length that is less than the length of the uncut hard mask line structures.

The substrate 10 can be a front-end-of-the-line (FEOL) level, a middle-of-the line (MOL) level, a lower interconnect level or any combination thereof. In one example, the substrate 10 is a FEOL level and a MOL level. In another example, the substrate 10 is a FEOL level, a MOL level and a lower interconnect level. An FEOL level is a level of a semiconductor structure that contains one or more semiconductor devices such as, for example, one or more transistors formed on, and/or within, a semiconductor substrate. A MOL level includes one or more MOL electrically conductive structures (via and/or lines) embedded in a MOL dielectric material layer. A lower interconnect level includes one or more interconnect structures embedded in an interconnect dielectric material. The FEOL level, the MOL level and/or the lower interconnect level that can be used to provide substrate 10 include materials that are well known to those skilled in the art, and such levels can be formed utilizing techniques that are also well known to those skilled in the art. So as not to obscure the method of the present application, the materials and processing techniques used to provide the FEOL level, the MOL level and/or the lower interconnect level are not described herein.

The electrically conductive material layer 12 that is formed on substrate 10 includes an electrically conductive metal or an electrically conductive metal alloy. Examples of electrically conductive metals that can be used to provide the electrically conductive material layer 12 include, but are not limited to, copper (Cu), aluminum (Al), tungsten (W), ruthenium (Ru), cobalt (Co) or iridium (Jr). Examples, of electrically conductive metal alloys that can be used to provide the electrically conductive material layer 12 include, but are not limited to, a Cu—Al alloy, a Co—Ru alloy, or a W—Co alloy. The electrically conductive material layer 12 can be formed utilizing a deposition process such as, for example, chemical vapor deposition (CVD), plasma enhanced chemical vapor deposition (PECVD), physical vapor deposition (PVD), sputtering, chemical solution deposition or plating.

The electrically conductive material layer 12 is formed as a blanket layer over the entirety of substrate 10. The electrically conductive material layer 12 can have a thickness from 20 nm to 100 nm; although other thicknesses for the electrically conductive material layer 12 are contemplated and can be used as the thickness of the electrically conductive material layer 12 in the present application.

The patterned hard mask, HM, includes one or more hard mask materials. In the illustrated embodiment, the patterned hard mask, HM, includes a single hard mask material. In other embodiments (not specifically illustrated), the patterned hard mask, HM, includes two or more hard mask materials stacked one atop the other. The hard mask material that provides the patterned hard mask, HM, can include at least one dielectric hard mask material, at least one metal hard mask material or a combination of dielectric hard mask materials and/or metal hard mask materials. Examples of dielectric hard mask materials that can be used to provide the patterned hard mask, HM, include, but are not limited to, silicon nitride, silicon oxynitride or aluminum oxide. Examples of metal hard mask materials that can be used to provide the patterned hard mask, HM, include, but are not limited to, titanium (Ti), titanium nitride (TiN), tantalum (Ta) or tantalum nitride (TaN). In the present application, the metal hard material that provides the patterned hard mask, HM, must be compositionally different from the electrically conductive metal or electrically conductive metal alloy that provides the electrically conductive material layer 12 such that the metal hard mask material that provides the patterned hard mask, HM, has a different etch rate as compared to the electrically conductive metal or electrically conductive metal alloy that provides the electrically conductive material layer 12.

The patterned hard mask, HM, includes a plurality of hard mask line structures 14 as described above that are spaced apart and are located on the electrically conductive material layer 12. In the present application, the plurality of hard mask line structures 14 are arranged in rows (run from left to right in FIG. 1) and columns (run from the top to the bottom) as is shown in FIG. 1. Within any given column of hard mask line structures 14, the hard mask line structures 14 can be cut or uncut as described above. In some embodiments, at least one of the hard mask line structures is a cut hard mask line structure. In other embodiments, each of the hard mask line structures is a non-cut hard mask line structure.

The patterned hard mask, HM, can be formed by first depositing a layer of at least one of the hard mask materials (i.e., dielectric and/or metal hard mask materials) mentioned above, and then patterning the as deposited layer of at least one hard mask material (hereinafter referred to as the deposited hard mask layer) by lithography and etching. In cases in which a cut hard mask line structure is formed, a hard mask cut mask and an additional etching step is used.

The at least one hard mask material can be formed by, for example, CVD, PECVD, PVD or atomic layer deposition (ALD). The as deposited hard mask layer can have a thickness from 10 nm to 100 nm; although other thicknesses for the as deposited hard mask layer are contemplated and can be used as the thickness of the as deposited hard mask layer in the present application. Lithography includes depositing at least a photoresist material on the as deposited hard mask layer, exposing the as deposited photoresist material to a pattern of irradiation (in the present application and to form the hard mask line structures 14 shown in FIG. 1, the pattern of irradiation is a line pattern), and developing the exposed as deposited photoresist material. In embodiments, one or more photolithographic masking layers such as, for example, a bottom antireflective coating (BARC), can be formed between the as deposited hard mask layer and the as deposited photoresist material. In FIG. 1, the as deposited photoresist material and optional one or more photolithographic masking layers are not shown since both the as deposited photoresist material and optional one or more photolithographic masking layers are removed from the structure after the as deposited hard mask layer is patterned. The etching step used to pattern the as deposited hard mask layer includes a wet etching process or a dry etching process that is selective in removing the hard mask material that provides the patterned hard mask, HM, as compared to the electrically conductive metal or electrically conductive metal alloy that provides the electrically conductive material layer 12.

Figure 2:
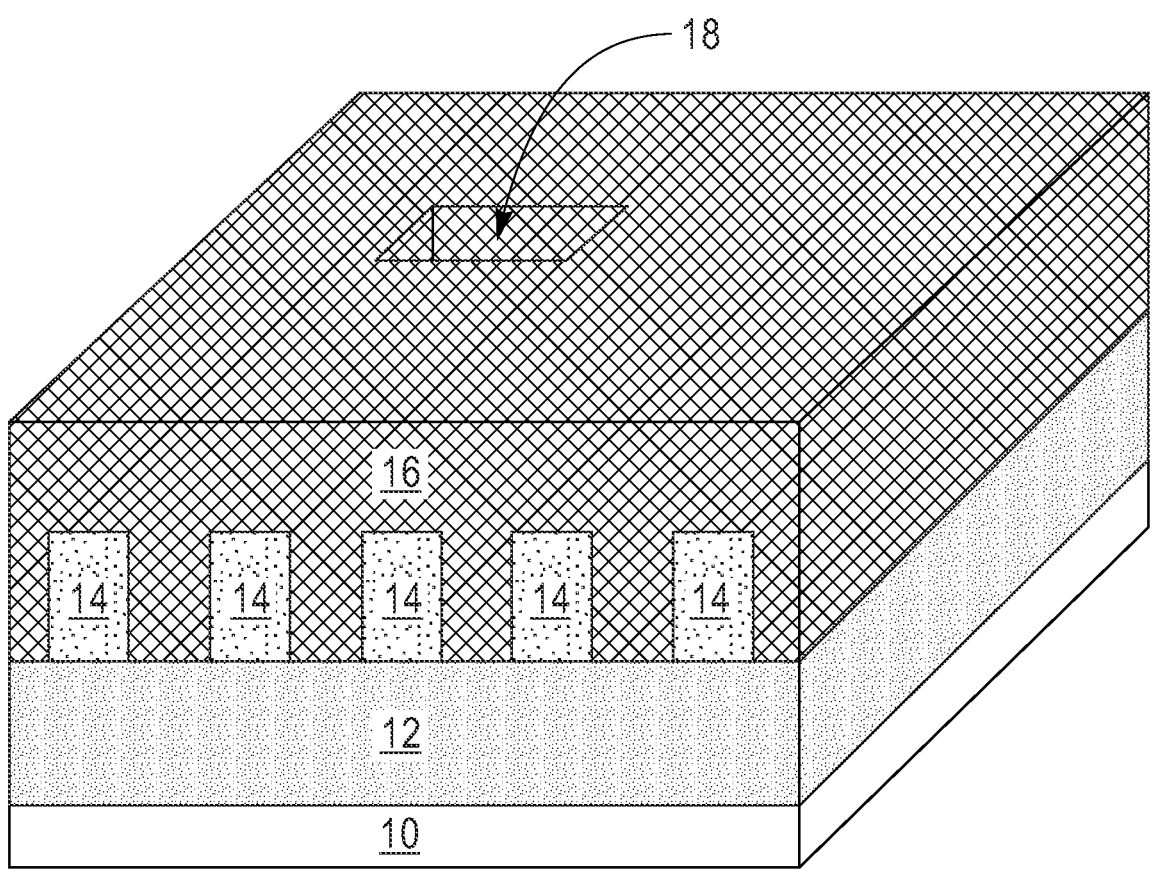
FIG. 2 is a 3D illustration of the exemplary structure shown in FIG. 1 after forming a planarization layer on, and between, the patterned hard mask, wherein the planarization layer contains an opening that extends to a surface of the electrically conductive material layer and is positioned between two adjacent hard mask line structures.

Referring now to FIG. 2, there is illustrated the exemplary structure shown in FIG. 1 after forming a planarization layer 16 on, and between, the patterned hard mask, HM, wherein the planarization layer 16 contains an opening 18 that extends to a surface of the electrically conductive material layer 12 and is positioned between two adjacent hard mask line structures 14 that are present in different columns from each other. It is noted that although the present application describes and illustrates the formation of a single opening 18 in the planarization layer 16, the present application works when more than one opening 18 is formed into the planarization layer 16. Each opening 18 is typically formed between two adjacent neighboring hard mask line structures 14 that are present in different columns from each other. The opening 18 can be vertically aligned to facing sidewalls of the two adjacent neighboring hard mask line structures 14, or the opening 18 can extend partially onto the surface of each of the two adjacent neighboring hard mask line structures 14; the opening 18 does not however physically expose an entirety of either of the two adjacent neighboring hard mask line structures 14.

The planarization layer 16 is typically composed of an organic material such as, for example, spin-on carbon or an optical planarization layer (OPL). The planarization layer 16 can be formed by a deposition process such as, for example, spin-on coating, CVD, or PECVD. The planarization layer 16 can be self-planarizing (i.e., it has a planarized topmost surface after deposited without any separate planarization process being used) or a separate planarization step can be used after deposition of the material that provides the planarization layer 16. The planarization layer 16 has a height that extends above the patterned hard mask, HM, as is shown, for example, in FIG. 2.

Opening 18 can be formed by lithography and etching. The lithographic step used to provide the opening 18 is similar to the lithographic step mentioned above to form the patterned hard mask, HM, except that the pattern of irradiation used to form the opening 18 is not a line pattern. In FIG. 2, the photoresist material and any optional photolithographic masking material used to form the opening 18 is not shown since the photoresist material and any optional photolithographic masking material are removed after forming the opening 18 in the planarization layer 16. The etch used to define the opening 18 in the planarization layer 16 is selective in removing the material that provides the planarization layer 16. In one example, the etch used to define the opening 18 in the planarization layer 16 includes plasma etching with, for example, oxygen containing plasma or hydrogen containing plasma.

Figure 3:
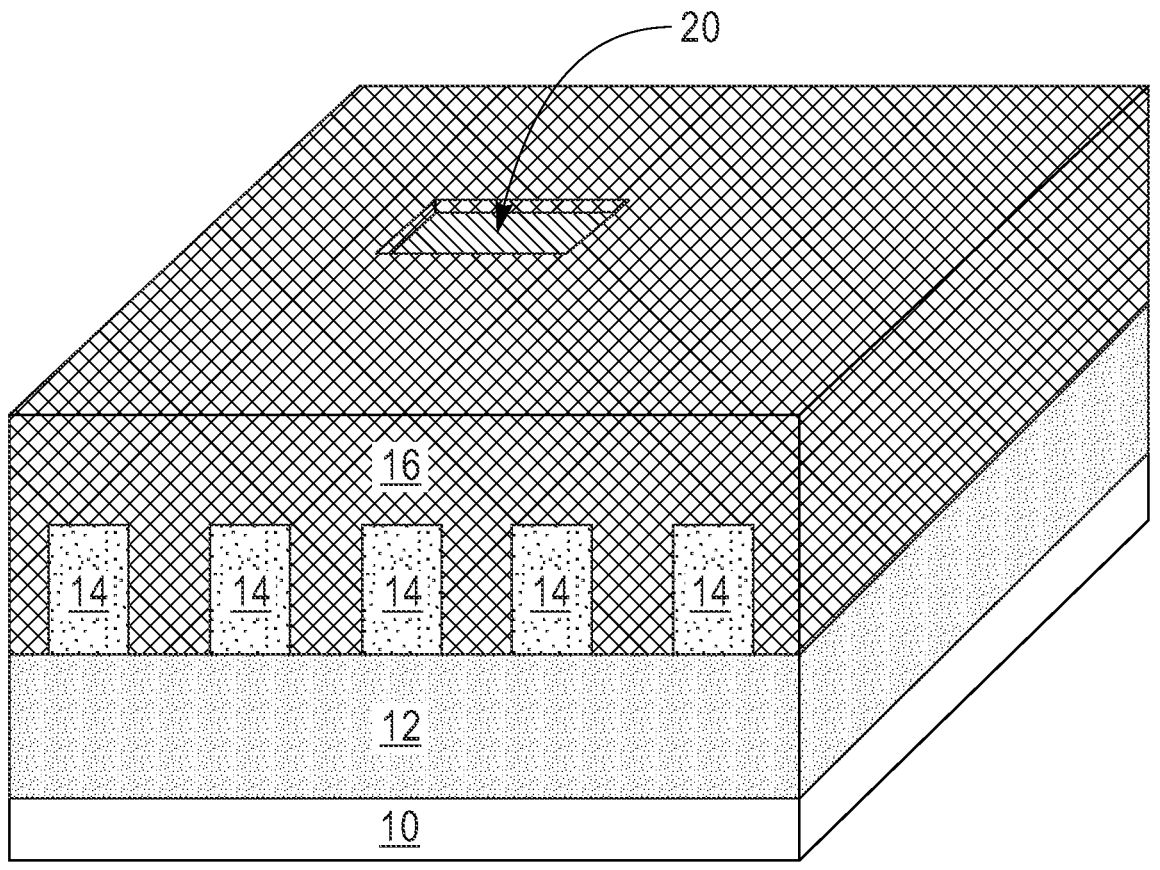
FIG. 3 is a 3D illustration of the exemplary structure shown in FIG. 2 after forming a tab forming sacrificial gap fill material structure in the opening.

Referring now to FIG. 3, there is illustrated the exemplary structure shown in FIG. 2 after forming a tab forming sacrificial gap fill material structure 20 in the opening 18. The tab forming sacrificial gap fill material structure 20 is composed of a sacrificial gap fill material. In some embodiments, the sacrificial gap fill material is a sacrificial dielectric material such as, for example, a flowable dielectric oxide. In other embodiments, the sacrificial gap fill material is a sacrificial metal such as, for example, Ti, TiN, Ta or TaN. The sacrificial metal that provides the tab forming sacrificial gap fill material structure 20 must be compositionally different from the electrically conductive metal or electrically conductive metal alloy that provides the electrically conductive material layer 12. The tab forming sacrificial gap fill material structure 20 can be formed by a deposition process including, for example, spin-on coating, CVD or ALD. An etch back process typically follows the deposition of the sacrificial gap fill material in the opening 18. After the etch back process, the tab forming sacrificial gap fill material structure 20 has a topmost that is located beneath the topmost surface of the planarization layer 16.

Figure 4:
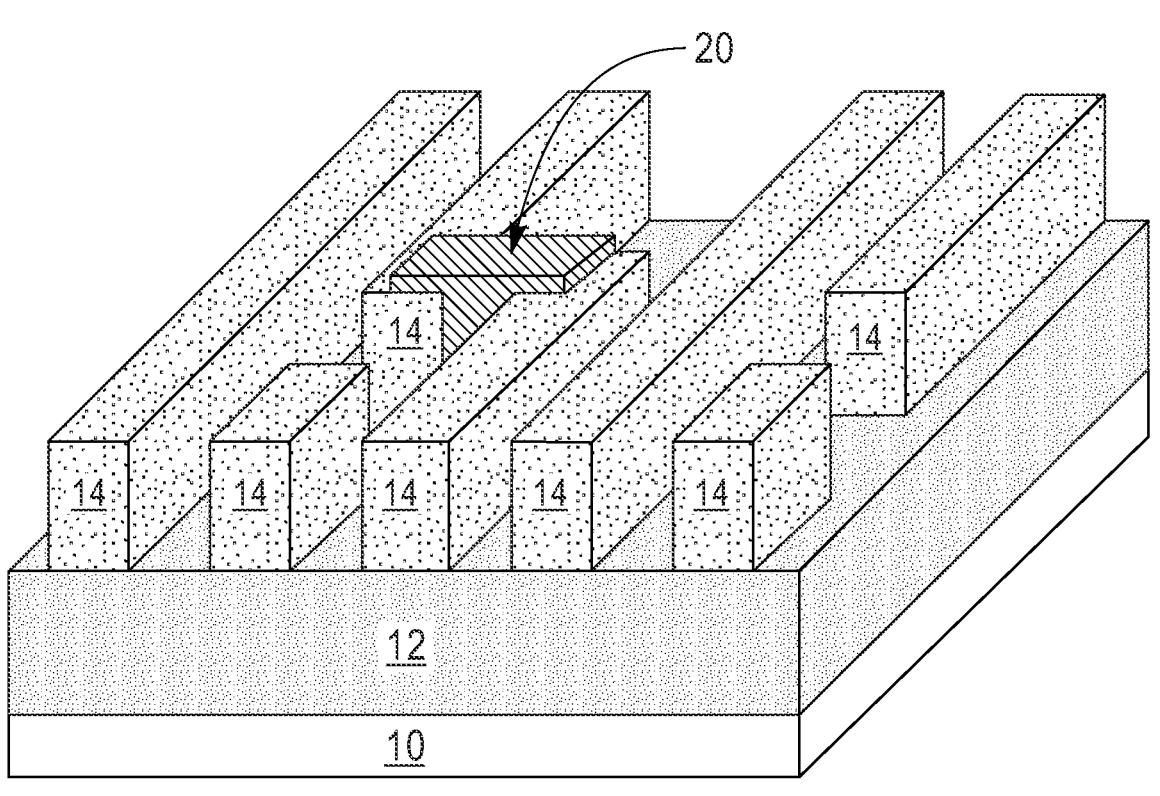
FIG. 4 is a 3D illustration of the exemplary structure shown in FIG. 3 after removing the planarization layer.
Figure 5:
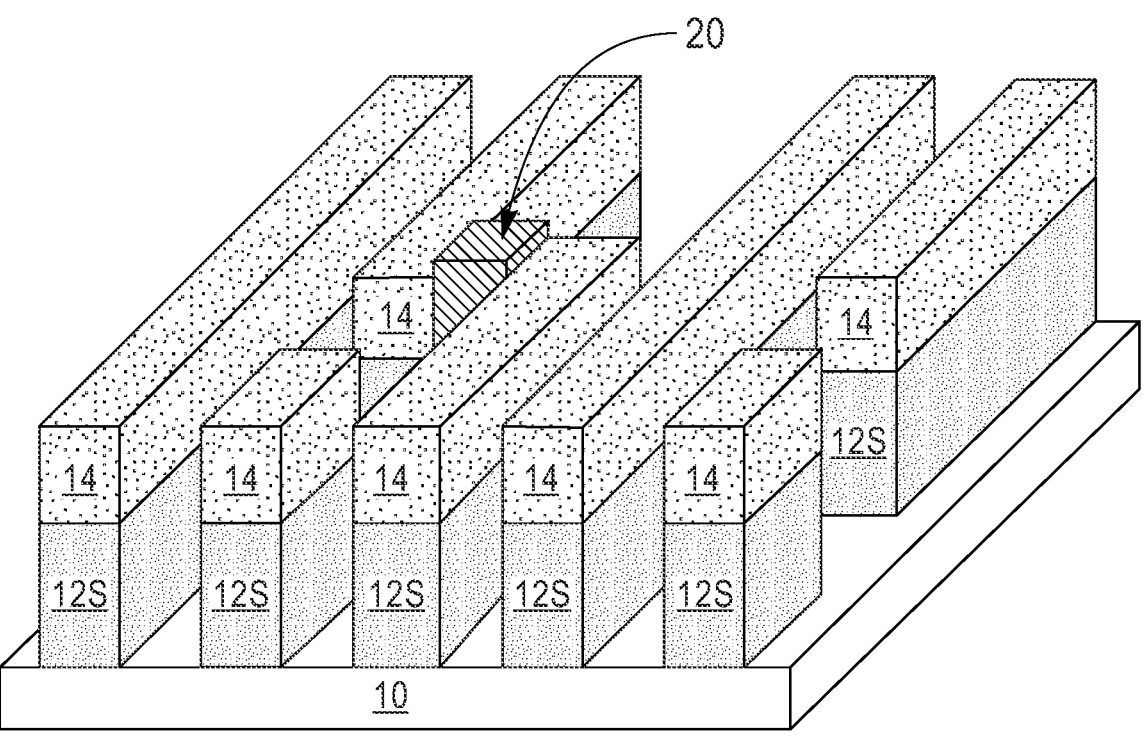
FIG. 5 is a 3D illustration of an exemplary structure similar to the one depicted in FIG. 4 after patterning the electrically conductive material layer utilizing the patterned hard mask and the tab forming sacrificial gap fill material structure as a combined etch mask.

Referring now to FIG. 4, there is illustrated the exemplary structure shown in FIG. 3 after removing the planarization layer 16 to reveal the tab forming sacrificial gap fill material structure and the patterned hard mask, HM. FIG. 4 shows an embodiment in which the tab forming sacrificial gap fill material structure 20 extends partially, but not completely, onto the two neighboring hard mask line structures 14. FIG. 5 shows an embodiment in which the tab forming sacrificial gap fill material structure 20 does not extend onto the two neighboring hard mask line structures 14; in this embodiment the tab forming sacrificial gap fill material structure has sidewalls that are vertically aligned to the two facing sidewalls of the two adjacent hard mask line structures 14.

In the present application, the planarization layer 16 can be removed from the exemplary structure utilizing an etching process that is selective in removing the material that provides the planarization layer 16. In one example, the etching process that is used to remove the planarization layer 16 includes a dry etch with, for example, an oxygen containing plasma or a hydrogen containing plasma.

Referring now to FIG. 5, there is illustrated an exemplary structure similar to the one depicted in FIG. 4 after patterning the electrically conductive material layer 12 utilizing the patterned hard mask, HM, and the tab forming sacrificial gap fill material structure 20 as a combined etch mask. As mentioned above, FIG. 5 shows an embodiment in which the tab forming sacrificial gap fill material structure 20 does not extend onto the two neighboring hard mask line structures 14. This step of the present application is also applicable for use with the exemplary structure shown in FIG. 4. The patterning of the electrically conductive material layer 12 includes a conductive metal etching process that is selective in removing the electrically conductive metal or electrically conductive metal alloy that provides the electrically conductive material layer 12. In FIG. 5, the remaining portion of the electrically conductive material layer 12 that is located beneath each patterned hard mask, HM, can be referred to as an electrically conductive metal-containing line 12S (the lines can be cut or uncut depending on whether the patterned hard mask line structures were cut or uncut) and the remaining portion of the electrically conductive material layer 12 that is beneath the tab forming sacrificial gap fill material structure 20 that is located between the two neighboring hard mask line structures (not seen in this drawn, but shown in FIG. 6) can be referred to as a connector tab 13. Note that connector tab 13 and the two neighboring electrically conductive metal-containing lines 12S that are connected together by the connector tab 13 are of unitary construction (i.e., a single work piece) and each element is composed of a same electrically conductive metal or electrically conductive metal alloy as the electrically conductive material layer 12.

Figure 6:
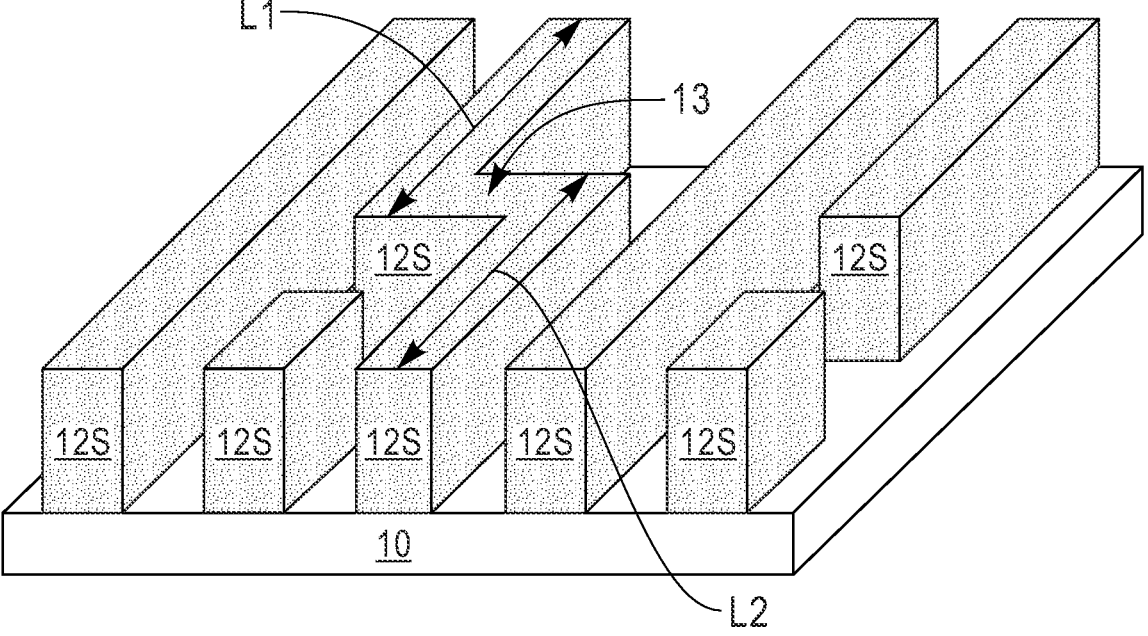
FIG. 6 is a 3D illustration of the exemplary structure shown in FIG. 5 after removing the patterned hard mask and the tab forming sacrificial gap fill material structure.

Referring now to FIG. 6, there is illustrated the exemplary structure shown in FIG. 5 after removing the patterned hard mask, HM, and the tab forming sacrificial gap fill material structure 20. The patterned hard mask, HM, and the tab forming sacrificial gap fill material structure 20 can be removing utilizing one or more etching processes. After removing the patterned hard mask, HM, and the tab forming sacrificial gap fill material structure 20, an interconnect dielectric material (not shown) can be formed laterally adjacent to, and above, the connector tab 13 and the electrically conductive metal-containing lines 12S, and further interconnect processing steps including formation of electrically conductive via structures within the interconnect dielectric material and in contact with some of the electrically conductive metal-containing lines 12S and additional interconnect levels can then be performed.

Notably, FIG. 6 illustrates an interconnect structure in accordance with an embodiment of the present application. The interconnect structure includes a first electrically conductive metal-containing line (e.g., the electrically conductive metal-containing line 122S that contains a first length, L1), a second electrically conductive metal-containing line 12S (e.g., the electrically conductive metal-containing line 122S that contains a second length, L2), and a connector tab 13 located between, and connecting, the first electrically conductive metal-containing line 12S and the second electrically conductive metal-containing line 12S. In accordance with the present application, the first electrically conductive metal-containing line 12S, the second electrically conductive metal-containing line 12S and the connector tab 13 are of unitary construction (i.e., a single piece) and are composed of a compositionally same electrically conductive material. The connector tab 13 typically has a topmost surface that is coplanar with a topmost surface of the first electrically conductive metal-containing line 12S and the second electrically conductive metal-containing line 12S that it is connected to.

In accordance with the present application, the first electrically conductive metal-containing line, the second electrically conductive metal-containing line and the connector tab 13 are located above substrate 10. As mentioned above, substrate 10 can be FEOL level, MOL level, a lower interconnect level or any combination thereof.

In the present application, the first electrically conductive metal-containing line has a first length, L1, and the second electrically conductive metal-containing line has a second length, L2, that can be the same or different from the first length, L1.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming an interconnect structure, the method comprising:

providing a patterned hard mask on a surface of an electrically conductive material layer, wherein the patterned hard mask comprises at least a first hard mask line structure and a second hard mask line structure, the second hard mask line structure is oriented parallel to the first hard mask line structure;

forming a planarization layer laterally adjacent to, and above, the first hard mask line structure and the second hard mask line structure, wherein the planarization layer is in direct physical contact with a topmost surface and a sidewall of both the first hard mask line structure and the second hard mask line structure and a topmost surface of the electrically conductive material layer, and the planarization layer comprises an opening that extends to the electrically conductive material layer and is located between the first hard mask line structure and the second hard mask line structure;

forming a tab forming sacrificial gap fill material structure in the opening;

removing the planarization layer to reveal each of the tab forming sacrificial gap fill material structure, the first hard mask line structure and the second hard mask line structure;

patterning the electrically conductive material layer utilizing the patterned hard mask and the tab forming sacrificial gap fill material structure as a combined etch mask to provide a first electrically conductive metal-containing line and a second electrically conductive metal-containing line that are connected together by a connector tab; and removing the patterned hard mask and the tab forming sacrificial gap fill material structure.

2. The method of claim 1, wherein the first electrically conductive metal-containing line, the second electrically conductive metal-containing line and the connector tab are of unitary construction and are composed of a compositionally same electrically conductive material.

3. The method of claim 2, wherein the first electrically conductive metal-containing line, the second electrically conductive metal-containing line and the connector tab are located in a same metallization level.

4. The method of claim 1, wherein the electrically conductive material layer is located above a substrate.

5. The method of claim 4, wherein the substrate is a front-end-of-the-line (FEOL) level, a middle-of-the-line (MOL) level, a lower interconnect level or any combination thereof.

6. The method of claim 1, wherein at least one of the first hard mask line structure and the second hard mask line structure is a cut hard mask line structure.

7. The method of claim 1, wherein each of the first hard mask line structure and the second hard mask line structure is a non-cut hard mask line structure.

8. The method of claim 1, wherein the patterned hard mask including the first hard mask line structure and the second hard mask line structure is composed of a dielectric hard mask material, a metal hard mask material or any combination thereof.

9. The method of claim 1, wherein the patterned hard mask including the first hard mask line structure and the second hard mask line structure are formed by lithography and etching.

10. The method of claim 1, wherein the opening partially extends onto the first hard mask line structure and partially onto the second hard mask line structure.

11. The method of claim 1, wherein the opening is vertically aligned to a sidewall of the first hard mask line structure and a sidewall of the second hard mask line structure.

12. The method of claim 1, wherein the forming the tab forming sacrificial gap fill material structure comprises deposition of a sacrificial gap fill material and etching back the sacrificial gap fill material.

13. The method of claim 1, wherein the patterning of the electrically conductive material layer comprises a conductive metal etching process.

14. The method of claim 1, wherein the removing of the patterned hard mask and the tab forming sacrificial gap fill material structure comprises one or more etching processes.

* * * * *